US010985517B2

(12) United States Patent
Deng et al.

(10) Patent No.: US 10,985,517 B2
(45) Date of Patent: Apr. 20, 2021

(54) APPARATUS FOR ASSEMBLING CASES MADE OF THIN PLATE

(71) Applicants: Tyco Electronics (Shanghai) Co. Ltd., Shanghai (CN); Tyco Electronics (Zhuhai) Ltd., Zhuhai (CN)

(72) Inventors: Yingcong Deng, Shanghai (CN); Lvhai Hu, Shanghai (CN); Zhiyong Dai, Shanghai (CN); Yun Liu, Shanghai (CN); Dandan Zhang, Shanghai (CN); Qiang Yu, Zhuhai (CN); Wei Chen, Zhuhai (CN); Ning Zhang, Zhuhai (CN)

(73) Assignees: Tyco Electronics (Shanghai) Co. Ltd., Shanghai (CN); Tyco Electronics (Zhuhai) Ltd, Zhuhai (CN)

( * ) Notice: Subject to any disclaimer, the term of this patent is extended or adjusted under 35 U.S.C. 154(b) by 303 days.

(21) Appl. No.: 16/139,124

(22) Filed: Sep. 24, 2018

(65) Prior Publication Data

US 2019/0027885 A1    Jan. 24, 2019

Related U.S. Application Data

(63) Continuation of application No. PCT/IB2017/051635, filed on Mar. 21, 2017.

(30) Foreign Application Priority Data

Mar. 22, 2016 (CN) .......................... 201610164692.2

(51) Int. Cl.
*H01R 43/18* (2006.01)
*H01R 31/00* (2006.01)
(Continued)

(52) U.S. Cl.
CPC ............. *H01R 43/18* (2013.01); *B21D 37/10* (2013.01); *B21D 37/12* (2013.01); *H01R 31/00* (2013.01); *H01B 13/22* (2013.01); *H05K 13/04* (2013.01)

(58) Field of Classification Search
CPC ........ H01R 43/18; H01R 31/00; H01B 13/22; H01B 13/04
See application file for complete search history.

(56) References Cited

U.S. PATENT DOCUMENTS 5,382,179 A * 1/1995 Noschese ........... H01R 13/6275
439/369
5,475,916 A * 12/1995 Schollenberger ...... H01R 43/18
29/267

(Continued)

FOREIGN PATENT DOCUMENTS

WO    2007079117 A1    7/2007
WO    WO-2012170022 A1 * 12/2012 ............. G06F 1/187

OTHER PUBLICATIONS

PCT Notification, The International Search Report and the Written Opinion of the International Searching Authority, dated Jun. 14, 2017, 11 pages.

*Primary Examiner* — Peter Dungba Vo
*Assistant Examiner* — Jeffrey T Carley
(74) *Attorney, Agent, or Firm* — Barley Snyder

(57) ABSTRACT

An assembling apparatus is adapted to assemble a case made of thin plate. The case has a bottom case and a top case, a latch formed on each side wall of the bottom case, and a locking spring formed on each side plate of the top case. When side plates of the top case are located at a predetermined position with respect to the top wall of the top case, the locking springs are fitted into the latches. The assembling apparatus includes a base configured to position and support the bottom case, an operation mechanism adapted to (Continued)

hold and move the top case, and a guide device disposed at the inner side of the latch. The guide device guides the side plate to the predetermined position, so that the locking spring on the side plate of the top case is capable of being fitted into the latch.

14 Claims, 6 Drawing Sheets

(51) Int. Cl.
      *B21D 37/10*      (2006.01)
      *B21D 37/12*      (2006.01)
      *H05K 13/04*      (2006.01)
      *H01B 13/22*      (2006.01)

(56) References Cited

U.S. PATENT DOCUMENTS

| | | | |
|---|---|---|---|
| 5,709,831 A * | 1/1998 | Endo | B29C 45/006 |
| | | | 264/238 |
| 6,368,153 B1 | 4/2002 | Hwang | |
| 2002/0068481 A1 | 6/2002 | Flickinger et al. | |
| 2005/0003696 A1 * | 1/2005 | Shirk | H01R 13/627 |
| | | | 439/352 |
| 2005/0260880 A1 * | 11/2005 | Seo | G02B 6/4261 |
| | | | 439/372 |
| 2006/0248711 A1 * | 11/2006 | Lu | H05K 5/0013 |
| | | | 29/760 |
| 2016/0120295 A1 * | 5/2016 | Rowley | F16M 11/10 |
| | | | 248/346.06 |

\* cited by examiner

APPARATUS FOR ASSEMBLING CASES MADE OF THIN PLATE

CROSS-REFERENCE TO RELATED APPLICATION

This application is a continuation of PCT International Application PCT/IB2017/051635 filed Mar. 21, 2017, which claims priority under 35 U.S.C. § 119 to CN 201610164692.2 filed on Mar. 22, 2016.

FIELD OF THE INVENTION

The present invention relates, in general, to an assembling apparatus, and, in particular, to an assembling apparatus adapted to assemble a case made of thin plate.

BACKGROUND

FIG. 1 is an illustrative perspective view of a typical case of a connector viewed from a bottom side and FIG. 2 is an illustrative perspective view the case of FIG. 1 viewed from a top side.

As shown in FIGS. 1 and 2, the case mainly comprises a bottom case 10, a top case 20 located above the bottom case 10 and at least one partition plate 30 provided between the bottom case 10 and the top case 20. The bottom case 10, the top case 20 and the partition plate 30 are all made of thin metal plate. The thin metal plate is easy to deform, therefore, in the process of machining, the side plates 21 of the top case 20 are easy to offset from a predetermined position, that is, a vertical position where the side plates 21 are perpendicular to the top wall of the top case 20. For example, the side plates 21 may slightly offset outward or slightly offset inward.

As shown in FIGS. 1 and 2, a latch 12 is formed on each side wall of the bottom case 10 and a locking spring 22 is formed on each side plate 21 of the top case 20. The latches 12 vertically and upwardly extend from both sides of a bottom wall of the bottom case 10, respectively. The side plates 21 vertically and downwardly extend from both sides of a top wall of the top case 20, respectively. The locking spring 22 protrudes outward from the side plate 21 of the top case 20.

As shown in FIGS. 1 and 2, the lock springs 22 are adapted to be fitted into the latches 12 from inner sides of the latches 12, respectively. In this way, the bottom case 10 and the top case 20 are assembled together.

A lower side of the partition plate 30 is adapted to be assembled to the bottom wall of the bottom case 10, and an upper side of the partition plate 30 is adapted to be assembled to the top wall of the top case 20. In this way, the space between the bottom case 10 and the top case 20 is divided into a plurality of receiving chambers 1 by the partition plate 30. In an embodiment, the lower side of the partition plate 30 is inserted into a slit formed in the bottom wall of the bottom case 10, and the upper side of the partition plate 30 is inserted into a slit formed in the top wall of the top case 20.

As shown in FIGS. 1 and 2, if the side plates 21 of the top case 20 offset from the predetermined position, the locking springs 22 on the side plates 21 of the top case 20 cannot be fitted into the latches 12.

In the prior art, the case shown in FIGS. 1 and 2 is generally assembled manually. Thereby, a worker has to correct the position of the side plates 21 of the top case 20 manually until the side plates 21 of the top case 20 are located in the vertical position where the side plates 21 are perpendicular to the top wall of the top case 20. However, manually correcting the position of the side plates 21 and manually assembling the case greatly reduce the assembly efficiency of the case.

SUMMARY

The present invention is apparatus for assembling a case made of thin plate. The case has a bottom case having side plates and side walls, a top case having a top wall and side plates, a latch on each side wall of the bottom case, and a locking spring on each side plate of the top case fitted into the latches from an inner side of the latches, respectively, when the side plates of the top case are at a predetermined position with respect to the top wall of the top case. The assembling apparatus comprises a base configured to position and support the bottom case, an operation mechanism adapted to hold and move the top case, and a guide device adapted to be disposed at the inner side of the latch and configured to guide the side plate to the predetermined position, so that the lock spring on the side plate of the top case is fitted into the latch smoothly.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
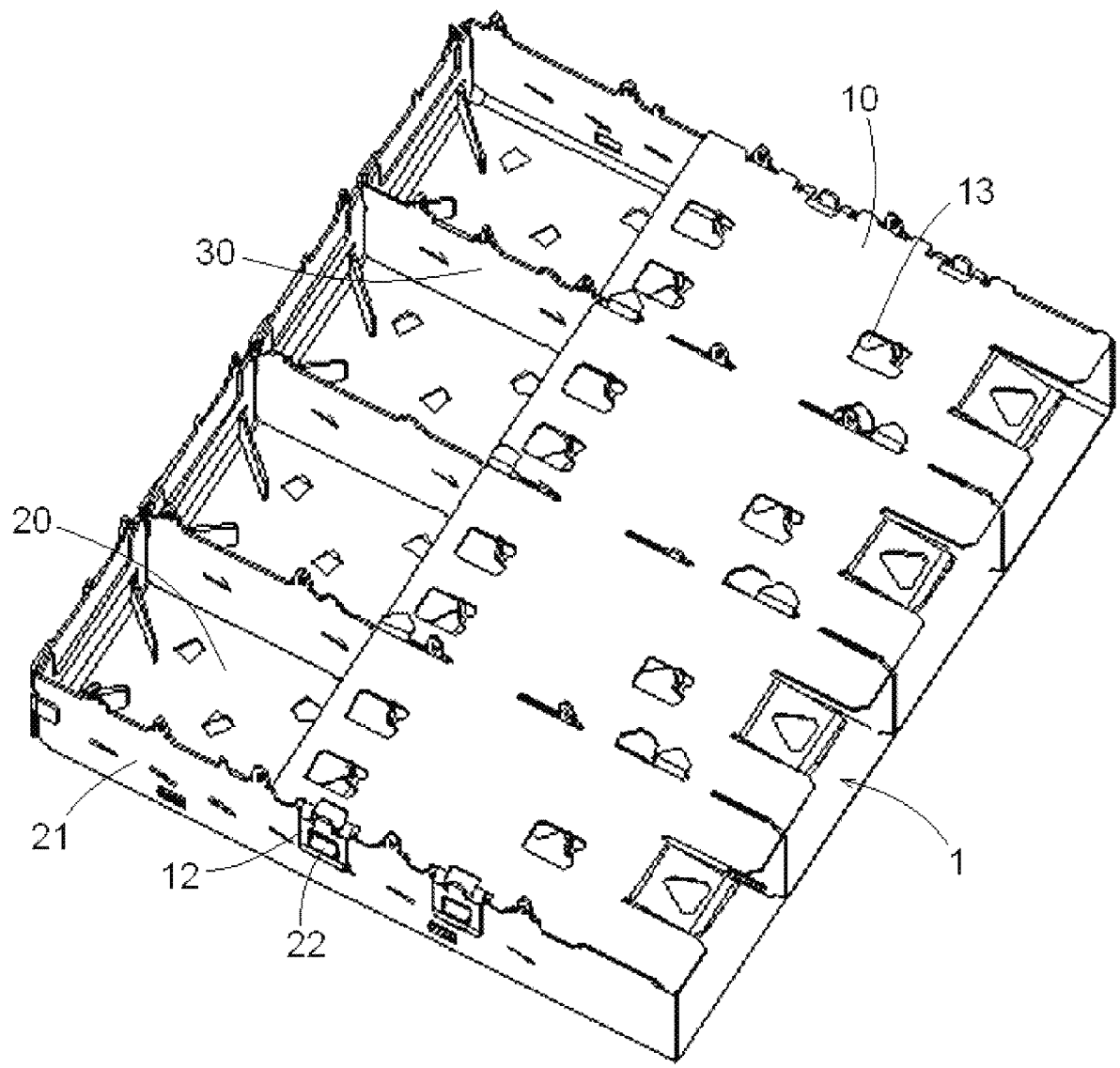
FIG. 1 is an illustrative perspective view of a typical case of a connector viewed from a bottom side.

Exemplary embodiments of the present disclosure will be described hereinafter in detail with reference to the attached drawings, wherein the like reference numerals refer to the like elements. The present invention may, however, be embodied in many different forms and should not be construed as being limited to the embodiments set forth herein; rather, these embodiments are provided so that the disclosure of the present invention will be thorough and complete and will fully convey the concept of the present invention to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
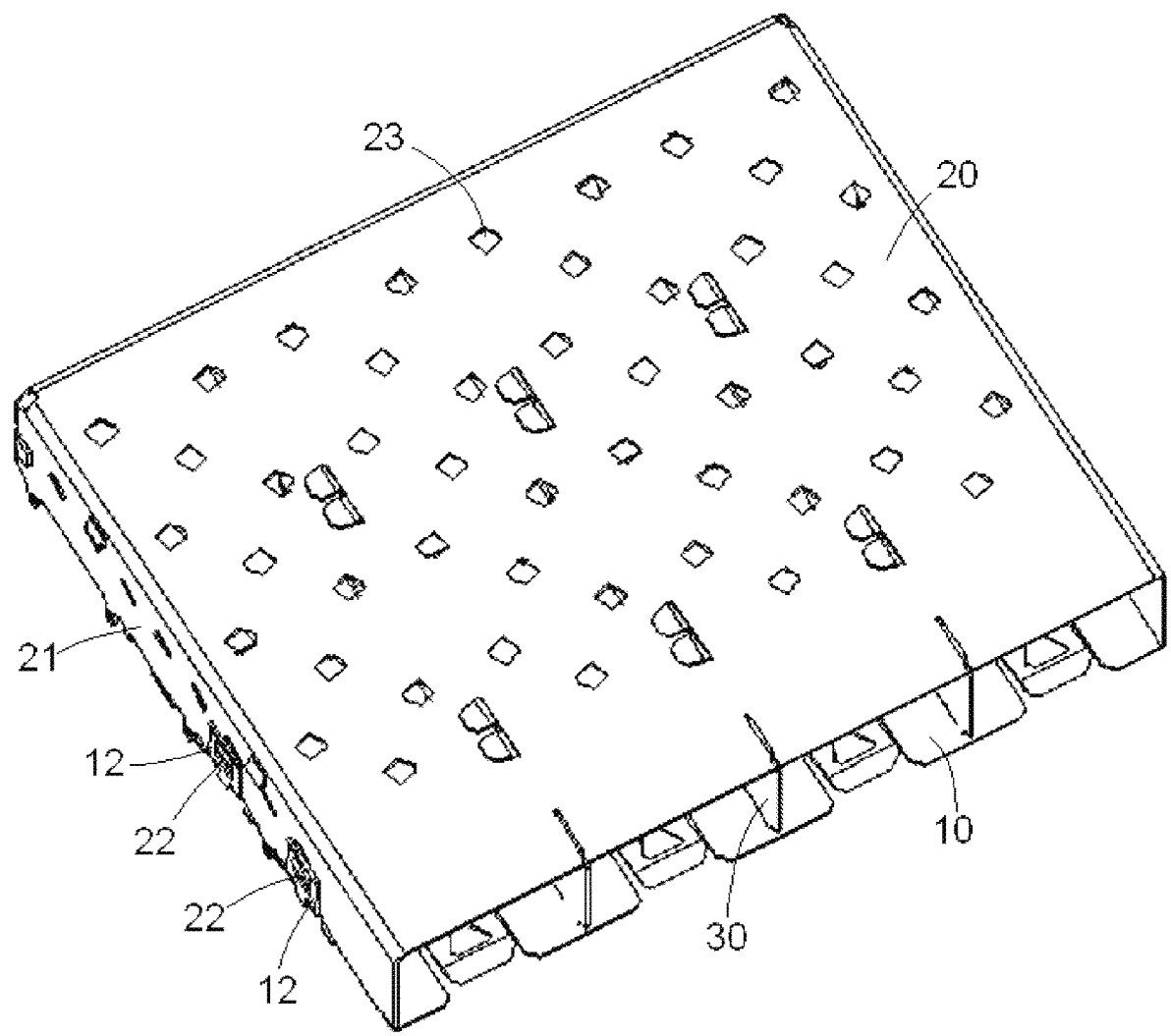
FIG. 2 is an illustrative perspective view the case of FIG. 1 viewed from a top side.
Figure 3:
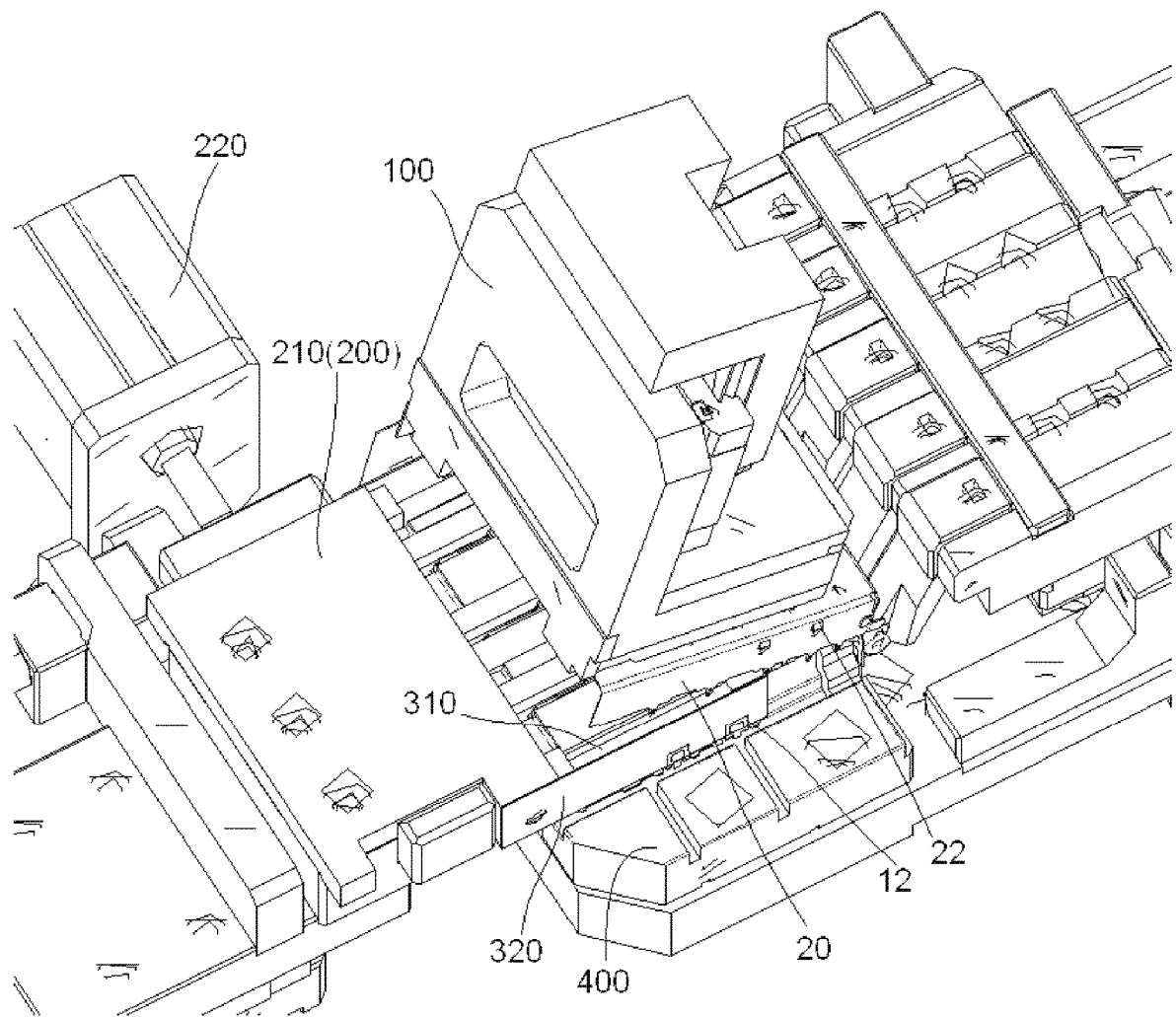
FIG. 3 shows an assembling apparatus for assembling the case shown in FIGS. 1 and 2 according to an exemplary embodiment of the present invention.
Figure 4:
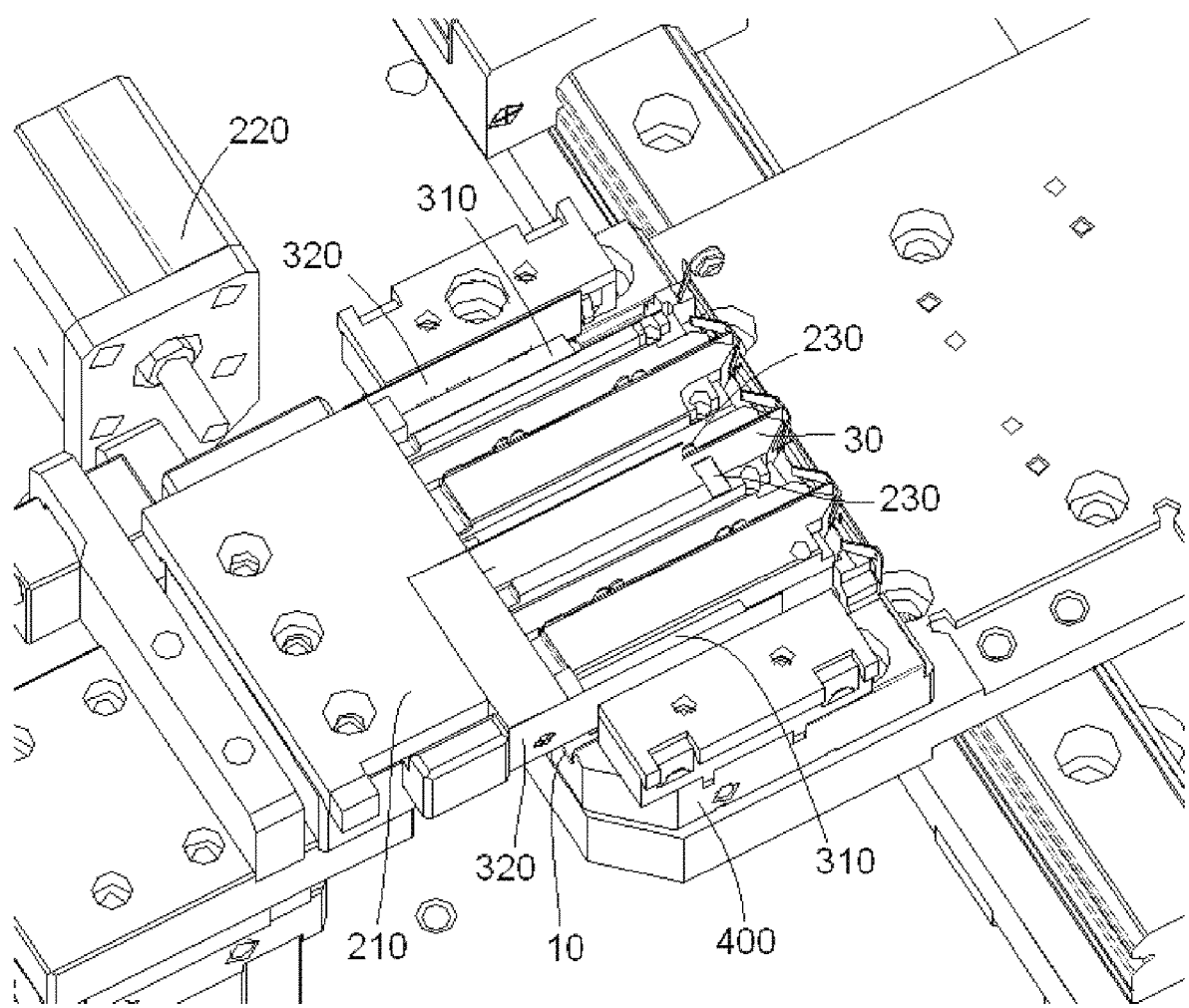
FIG. 4 shows the assembling apparatus for assembling the case shown in FIGS. 1 and 2 according to the exemplary embodiment of the present invention, in which an operation mechanism is removed.

FIG. 3 shows an assembling apparatus, constructed in accordance with an exemplary embodiment of the present invention, for assembling the case shown in FIGS. 1 and 2, and FIG. 4 shows the assembling apparatus for assembling the case shown in FIGS. 1 and 2 according to the exemplary embodiment of the present invention, in which an operation mechanism 100 is removed.

As shown in FIGS. 3 and 4, in an embodiment of the present invention, the assembling apparatus mainly comprises an operation mechanism 100, a guide device 310, 320, and a base 400. The bottom case 10 is adapted to be positioned and supported on the base 400. The operation mechanism 100 is configured to hold and move the top case 20, so as to assemble the top case 20 on the bottom case 10. The guide device 310, 320 is disposed at the inner side of the latch 12 and configured to guide the side plate 21 to the predetermined position, so that the lock spring 22 on the side plate 21 of the top case 20 is smoothly fitted into the latch 12. In this way, it may improve the assembly efficiency of the case made of thin plate.

Figure 5:
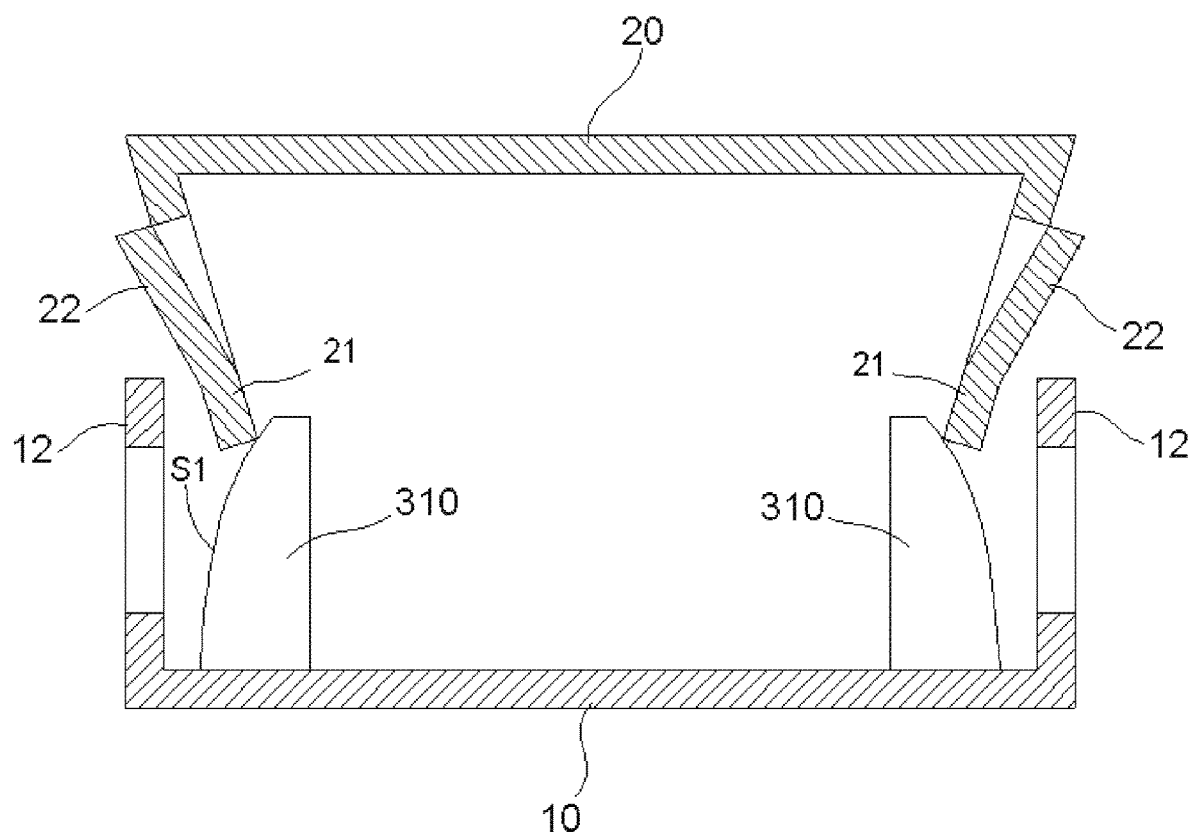
FIG. 5 is an illustrative view of correcting a position deviation of the side plates, which are offset inward from a predetermined position, by a first guide device.

FIG. 5 is an illustrative view of correcting a position deviation of the side plates 21, which offset inward from a predetermined position, by a first guide device 310.

As shown in FIGS. 3, 4, and 5, in an embodiment of the present invention, the guide devices 310, 320 comprise a first guide device 310 having a first guide surface S1 facing the inner side of the latch 12. As shown in FIG. 5, when the top case 20 is moved downward, the first guide surface S1 is adapted to push the side plates 21 outward, so as to gradually expand the distance between the side plates 21. In this way, the side plates 21 may be gradually moved to the predetermined position, for example, a vertical position where the side plates 21 are perpendicular to the top wall of the top case 20 and the position deviation of the side plates 21 may be automatically corrected by the first guide device 310. After the side plates 21 are moved to the predetermined position, the lock springs 22 on the side plates 21 of the top case 20 are capable of being smoothly fitted into the latches 12, respectively.

Figure 6:
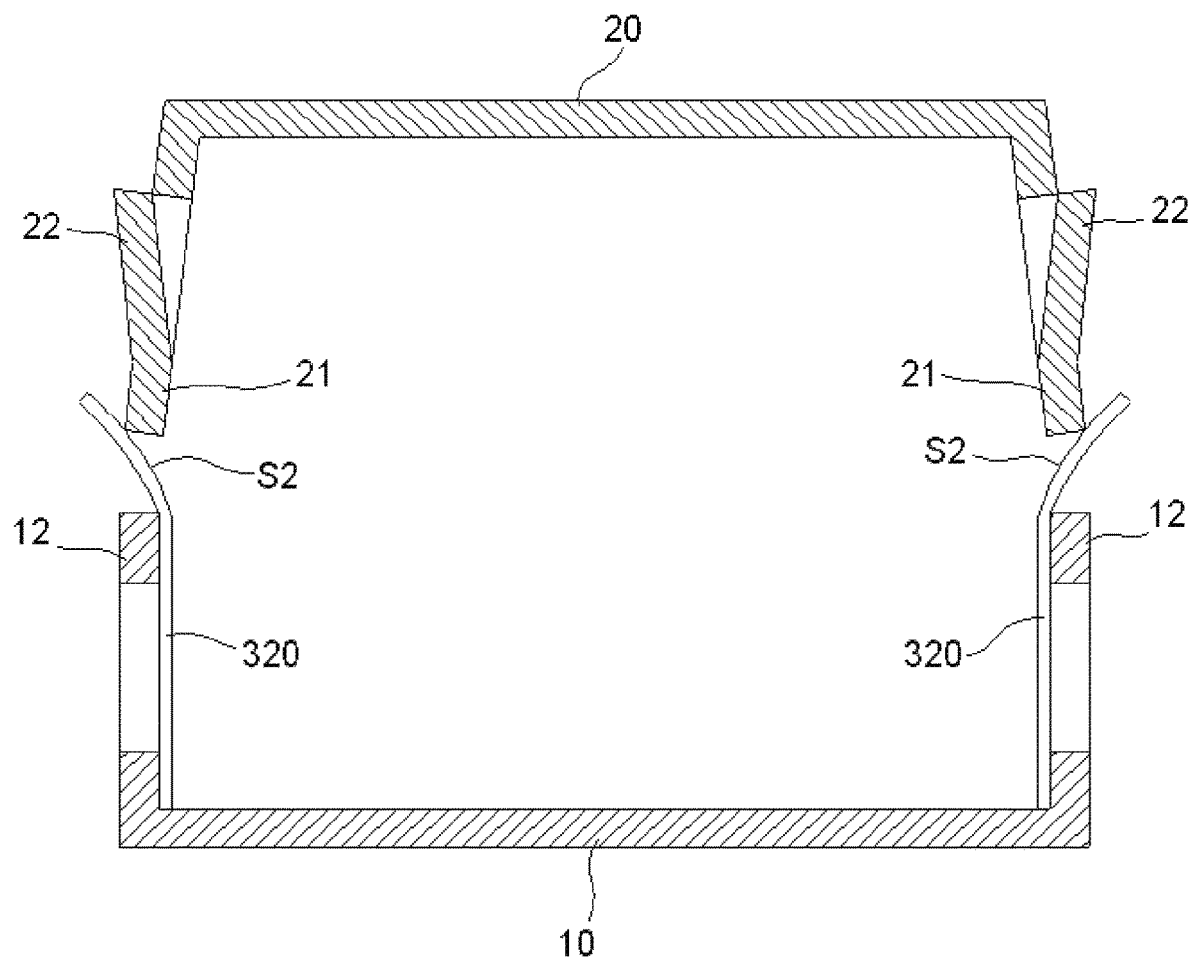
FIG. 6 is an illustrative view of correcting a position deviation of the side plates, which are offset outward from a predetermined position, by a second guide device.

FIG. 6 is an illustrative view of correcting a position deviation of the side plates 21, which offset outward from a predetermined position, by a second guide device 320.

As shown in FIGS. 3, 4, and 5, in an embodiment of the present invention, the guide devices 310, 320 further comprise a second guide device 320 having a second guide surface S2 facing the first guide device 310. As shown in FIG. 6, when the top case 20 is moved downward, the second guide surface S2 is adapted to push the side plates 21 inward, so as to gradually narrow the distance between the side plates 21. In this way, the side plates 21 may be gradually moved to the predetermined position, for example, a vertical position where the side plates 21 are perpendicular to the top wall of the top case 20 and the position deviation of the side plates 21 may be automatically corrected by the second guide device 320. After the side plates 21 are moved to the predetermined position, the lock springs 22 on the side plates 21 of the top case 20 are capable of being smoothly fitted into the latches 12, respectively.

In an exemplary embodiment of the present invention, the first guide device 310 may be formed as a rigid block with a stiffness larger than that of the side plates 21. The second guide device 320 may be formed as a flexible sheet with a flexibility larger than that of the side plates 21. In an embodiment of the present invention, the thickness of the flexible sheet is less than that of the case. Generally, the flexible sheet may be made of alloy, for example, Zinc alloy, with a stiffness less than that of the case.

It should be noted that, in the embodiment of the present invention shown in FIG. 6, after the side plates 21 are guided to the correct vertical position by the second guide device 320, the second guide device 320 needs to be pulled out from a position between the latch 12 of the top case 10 and the side plate 21 of the top case 20. After the second guide device 320 is pulled out, the locking springs 22 on the side plates 21 may be introduced into holes formed in the latches 12, respectively. Sometimes, in order to ensure that the locking springs 22 are to be fully assembled into the holes in the latches 12, the operating mechanism 100 may drive the top case 30 to swing several times between both sides of the bottom case 10, so as to force the locking springs 22 on the side plates 21 to be fully assembled into the holes in the latches 12.

As shown in FIGS. 1, 2, 3, and 4, the assembling apparatus further comprises a holding mechanism 200 configured to hold the partition plate 30 in a position where the partition plate 30 is perpendicular to the bottom wall of the bottom case 10. In this way, after the top case 20 is assembled to the bottom case 10, the upper side of the partition plate 30 is inserted into the slit formed in the top wall of the top case 20 and assembled to the top case 20.

As shown in FIGS. 3 and 4, in an embodiment of the present invention, the holding mechanism 200 comprises at least one pair of clamping fingers 230 each adapted to clamp the partition plate 30 from both sides thereof.

As shown in FIGS. 3 and 4, in an embodiment of the present invention, the holding mechanism 200 further comprises a first driving mechanism 210 adapted to drive the at least one pair of clamping fingers 230 to move in a direction parallel to the partition plate 30, so as to move the at least one pair of clamping fingers 230 to or from the partition plate 30.

As shown in FIGS. 3 and 4, in an embodiment of the present invention, the holding mechanism 200 further comprises a second driving mechanism 220 adapted to drive the at least one pair of clamping fingers 230 to close or open, so as to clamp or release the partition plate 30.

As shown in FIGS. 3 and 4, in an embodiment of the present invention the first guide device 310 and the second guide device 320 both are attached to the first driving mechanism 210. Thereby, the first driving mechanism 210 is further adapted to drive the guide devices 310, 320 to move in a horizontal direction parallel to the partition plate 30, so as to move the guide devices 310, 320 to or from the latch 22.

As shown in FIGS. 5 and 6, in an embodiment of the present invention, the first guide surface S1 and/or the second guide surface S2 may be formed as a smooth arc guide surface or a smooth slope guide surface.

As shown in FIGS. 3 and 4, in an embodiment of the present invention, the operation mechanism 100 comprises a robot and a vacuum adsorption device mounted on the robot. The vacuum adsorption device is adapted to pick up the top case 20 and the robot is adapted to move the top case 20 picked by the vacuum adsorption device.

As shown in FIGS. 1, 2, 3, and 4, in an embodiment of the present invention, a plurality of first holes 23 are formed in the top case 20 and a plurality of first position posts are formed on the operation mechanism 100. The plurality of first position posts are adapted to be inserted into the first plurality of holes 23, respectively, so as to position the top case 20 picked by the vacuum adsorption device.

As shown in FIGS. 1, 2, 3, and 4, in an embodiment of the present invention, a plurality of second holes 13 are formed in the bottom case 10 and a plurality of second position posts are formed on the base 400. The plurality of second position posts are adapted to be inserted into the plurality of second holes 13, respectively, so as to position the bottom case 10 supported on the base 400.

Hereinafter, there is described an operation of assembling the case shown in FIGS. 1 and 2 by the assembling apparatus according to the exemplary embodiment of the present invention.

firstly, placing the bottom case 10 on the base 400 by the operation mechanism 100;

then, assembling the partition plate 30 to the bottom case 10 by the operation mechanism 100;

then, moving the guide devices 310, 320 to the inner side of the latch 12 of the bottom case 10 and moving the at least one pair of clamping fingers 230 to the partition plate 30 by the first driving mechanism 210;

then, driving the at least one pair of clamping fingers 230, by the second driving mechanism 220, to close and clamp the partition plate 30;

then, as shown in FIG. 3, moving the top case 20 downward, by the operation mechanism 100, until the top case 20 reaches a preset position;

then, driving the at least one pair of clamping fingers 230, by the second driving mechanism 220, to open and release the partition plate 30;

then, moving the guide devices 310, 320 and the at least one pair of clamping fingers 230 out of the case by the first driving mechanism 210;

finally, taking away the assembled case by the operation mechanism 100.

It should be appreciated by those skilled in this art that the above embodiments of the present invention are intended to be illustrated and not restrictive. For example, many modifications may be made to the above embodiments of the present invention by those skilled in this art and various features described in the different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the present invention, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An assembling apparatus for assembly of a case made of thin plate and comprising:
   a bottom case having side walls;
   a top case having a top wall and side plates;
   a latch on each side wall of the bottom case; and
   a locking spring on each side plate of the top case fitted into the latches from an inner side of the latches, respectively, when the side plates of the top case are at a predetermined position with respect to the top wall of the top case; and
   the assembling apparatus comprising:
   a base configured to position and support the bottom case;
   an operation mechanism adapted to hold and move the top case; and
   a guide device adapted to be disposed at the inner side of each of the latches and configured to guide the side plates to the predetermined position, so that the locking springs on the side plates of the top case are fitted into the latches.

2. The assembling apparatus according to claim 1, wherein the guide device has a first guide device with a first guide surface facing the inner side of each of the latches and is adapted to push the side plates outward, so as to gradually expand the distance between the side plates.

3. The assembling apparatus according to claim 2, wherein the guide device has a second guide device with a second guide surface facing the first guide device and is adapted to push the side plates inward, so as to gradually narrow the distance between the side plates.

4. The assembling apparatus according to claim 3, wherein when the side plates are located at the predetermined position, the side plates are perpendicular to a top surface of the top case and a bottom surface of the bottom case.

5. The assembling apparatus according to claim 4, wherein the case further comprises at least one partition plate having a lower side adapted to be assembled to a bottom wall of the bottom case and an upper side adapted to be assembled to the top wall of the top case, so as to divide a space between the bottom case and the top case into a plurality of receiving chambers.

6. The assembling apparatus according to claim 5, further comprising a holding mechanism configured to hold one of the at least one partition plates in a position where the one partition plate is perpendicular to the bottom wall of the bottom case.

7. The assembling apparatus according to claim 6, wherein the holding mechanism comprises at least one pair of clamping fingers each adapted to clamp the one partition plate from both sides thereof.

8. The assembling apparatus according to claim 7, wherein the holding mechanism further comprises a first driving mechanism adapted to drive the at least one pair of clamping fingers to move in a direction parallel to the one partition plate, so as to move the at least one pair of clamping fingers to or from the one partition plate.

9. The assembling apparatus according to claim 8, wherein the holding mechanism further comprises a second driving mechanism adapted to drive the at least one pair of clamping fingers to close or open, so as to clamp or release the one partition plate.

10. The assembling apparatus according to claim 9, wherein the first driving mechanism is further adapted to drive the guide device to move in a horizontal direction parallel to the one partition plate, so as to move the guide device to or from the latches.

11. The assembling apparatus according to claim 3, wherein the first guide device is a rigid block with a stiffness larger than that of the side plates and the second guide device is a flexible sheet with a flexibility larger than that of the side plates.

12. The assembling apparatus according to claim 1, wherein the operation mechanism comprises a robot adapted to pick up the top case by vacuum pick up and move the top case.

13. The assembling apparatus according to claim 12, wherein:
   (a) the top case has a plurality of first holes, and
   (b) the operation mechanism has a plurality of first position posts adapted to be inserted into the first plurality of holes, respectively, so as to position the top case for vacuum pick up.

14. The assembling apparatus according to claim 13, wherein the bottom case has a plurality of second holes and the base has a plurality of second position posts adapted to be inserted into the plurality of second holes, respectively, so as to position the bottom case supported on the base.

\* \* \* \* \*